(12) United States Patent
Usami et al.

(10) Patent No.: US 6,728,019 B2
(45) Date of Patent: Apr. 27, 2004

(54) OPTICAL GATE AND OPTICAL PHASE MODULATOR

(75) Inventors: Masashi Usami, Kamifukuoka (JP); Kosuke Nishimura, Kamifukuoka (JP); Munefumi Tsurusawa, Kamifukuoka (JP)

(73) Assignee: KDD Submarine Cable Systems Inc., Tokyo (JP)

( * ) Notice: Subject to any disclaimer, the term of this patent is extended or adjusted under 35 U.S.C. 154(b) by 259 days.

(21) Appl. No.: 09/898,274

(22) Filed: Jul. 2, 2001

(65) Prior Publication Data

US 2002/0003650 A1 Jan. 10, 2002

(30) Foreign Application Priority Data

Jul. 7, 2000 (JP) .......................... 2000-205991
Apr. 27, 2001 (JP) ........................ 2001-132083

(51) Int. Cl.$^7$ ............... G02F 1/03; G02F 1/29; H04B 10/12
(52) U.S. Cl. ............ 359/248; 359/247; 359/245; 359/299; 359/301; 359/304; 398/150; 398/147
(58) Field of Search ................. 359/248, 247, 359/245, 238, 250, 251, 252, 263, 299, 301, 302, 304; 398/147, 150

(56) References Cited

U.S. PATENT DOCUMENTS

| 4,382,660 A | * | 5/1983 | Pratt, Jr. et al. ............ 359/244 |
| 5,166,946 A | * | 11/1992 | Caldwell ..................... 372/50 |
| 5,742,415 A | | 4/1998 | Manning et al. |
| 5,798,853 A | * | 8/1998 | Watanabe ................... 359/160 |
| 2001/0022431 A1 | * | 9/2001 | Yao ............................. 359/334 |

OTHER PUBLICATIONS

N. S. Patel, et al., "40–Gbit/s cascadable all–optical logic with an ultrafast nonlinear interferometer," Optics Letters/ vol. 21, No. 18, pp 1466–1468, 09/1996.

K. L. Hall, et al., "100–Gbit/s bitwise logic," Optics Letters/ vol. 23, No. 16, pp 1271–1273, 08/1998.

Dupertuis, M, et al., "*Extremely fast, high–gain and low–current semiconductor optical amplifier by optical speed–up at transparency*", Conference on lasers and electro–optics Technical Digest May 12, 2000, XP–002225472, page 470.

Tsurusawa, M, et al., "New Method for Reduction of Carrier Lifetime in Semiconductor Optical Amplifier Using Assist Light", Japanese Journal of Applied Physics, vol. 38, Pt. 1, No 2B, XP–000934515, pp. 1265–1268.

European Search Report dated Jan. 13, 2003, for corresponding International patent application EP 01 11 5311.

\* cited by examiner

*Primary Examiner*—Georgia Epps
*Assistant Examiner*—Timothy J Thompson
(74) *Attorney, Agent, or Firm*—Christie, Parker & Hale, LLP

(57) ABSTRACT

An optical gate according to the invention comprises a polarization divider to divide an optical signal into two orthogonal polarization components and to output them as a first polarization component which precedes in the time base and a second polarization component which follows the first one in the time base; a semiconductor optical amplifier to modulate the phase of the second polarization component output from the polarization divider according to a control light; an assist light supplier to supply to the semiconductor optical amplifier an assist light to help the recovery of the refractive index variation of the semiconductor optical amplifier caused by the control light; a polarization combiner to combine the first and second polarization components of the optical signal transmitting on the semiconductor optical amplifier so as to adjust them in the same time location; and a polarization extractor to extract a predetermined polarization direction component from the output from the polarization combiner.

15 Claims, 9 Drawing Sheets

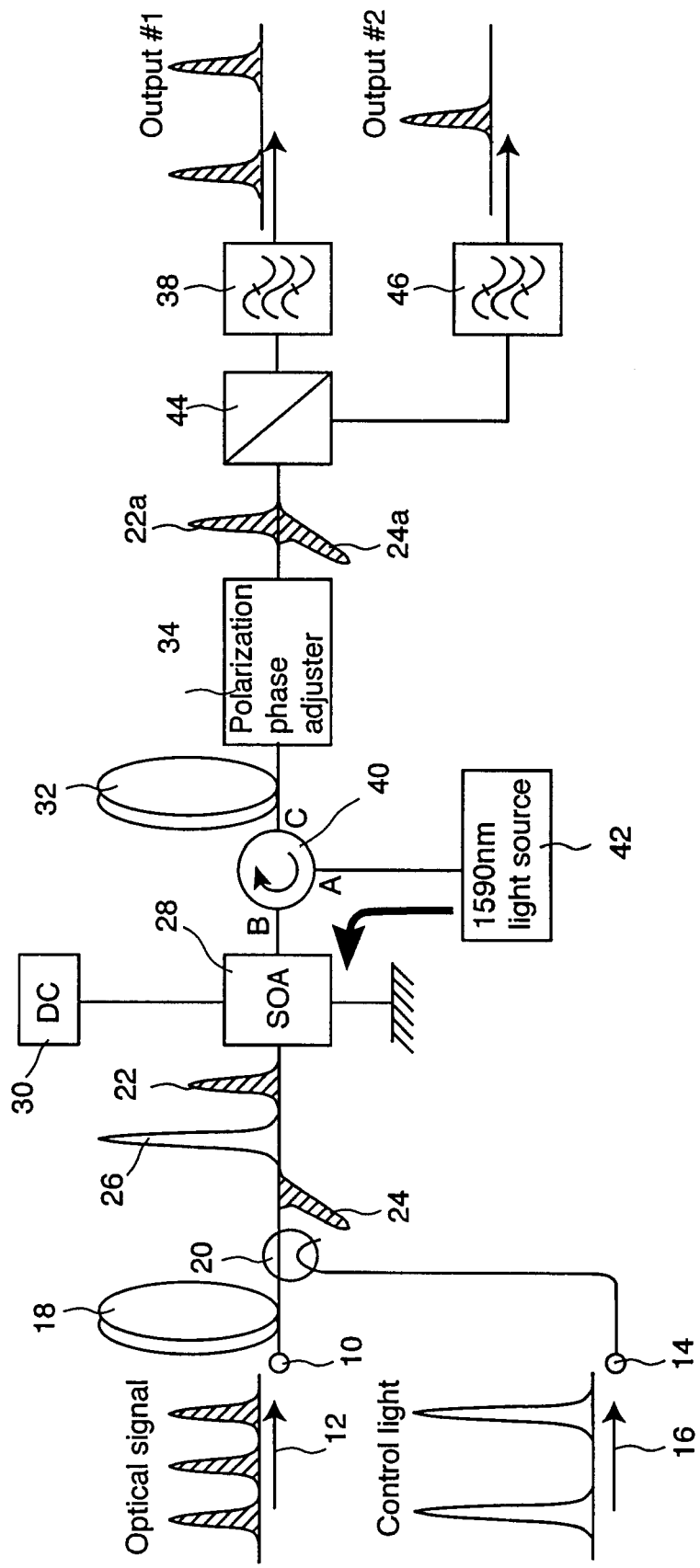

OPTICAL GATE AND OPTICAL PHASE MODULATOR

CROSS-REFERENCE TO RELATED APPLICATION

This application claims priority of Japanese patent Application No. 2000-205991, filed on Jul. 7, 2000, and Japanese patent Application No. 2001-132083, filed on Apr. 27, 2001.

FIELD OF THE INVENTION

This invention relates to an optical gate and an optical phase modulator, and more specifically relates to an optical gate applicable to optical transmission systems, optical network systems and optical switching systems and to an optical phase modulator useful for realizing such an optical gate.

BACKGROUND OF THE INVENTION

To realize an ultra large capacity and ultra high speed optical communication system, it is important to obtain an optical gate element capable of switching ON/OFF of an optical signal using the light. Especially, when a signal transmission rate per wavelength becomes as fast as 10 Gb/s or more, it is difficult to process a signal electrically in terms of the operation speed and the energy consumption. Accordingly, an optical gate or an optical switch to directly turn ON/OFF or to switch the optical signal using another optical signal has enthusiastically developed.

There are several types of conventional optical switches, for example, one using cross gain modulation (XGM) in a medium whose gain nonlinearly varies according to the intensity of input light such as a semiconductor optical amplifier (SOA), one using cross phase modulation (XPM) in a medium whose refractive index nonlinearly varies according to the intensity of input light such as a SOA, and the one using four wave mixing (FWM).

The response speed of the optical switch using the FWM is extremely high. However, it has a demerit to need high power for the ON/OFF of the light because its conversion efficiency is small and its wavelength dependency is large.

The optical switch using the XGM or XPM has a large switching efficiency because both XGM and XPM utilize the phenomena based on the process causing the pumping of actual carriers. It is reported that in the XPM, by switching ON/OFF of the optical signal by a control light pulse in an interference system, the operation speed of 10 Gb/s or more can be realized. However, since the standard XPM utilizes interferometers having two light paths such as Mach-Zehnder interferometers or Michelson interferometers, the circuit tends to be complicated. Furthermore, it is difficult to adjust the operation conditions of the two SOAs in a necessary perfect balance.

As means to solve the above problems in the XPM, having proposed is an optical switch to have a polarization division interferometer circuit configuration which physically has a single light path by dividing an optical signal into two orthogonal polarization components using a birefringent medium, and combining the two orthogonal polarization components again after passing them through the SOA of the nonlinear medium (for example, see N. S. Patel et al. Optics Letters, vol. 21, pp. 1466–1468, 1996). This optical switch is called as Ultrafast Nonlinear Interferometer (UNI).

FIG. 7 shows a schematic diagram of the optical switch disclosed in the above-mentioned paper. An optical signal 212 of wavelength 1550 nm enters an optical signal input port 210, and a control light 216 of wavelength 1540 nm enters a control light input port 214. The optical signal 212 contains, for example, a 40 Gbit/s optical clock signal of linear polarization, and the control light 216 contains a 40 Gbit/s optical RZ pulse train synchronized with the optical signal 212.

The optical signal output 212 from the optical signal input port 210 enters a 7.5 m long polarization preserving fiber 218 at an angle of 45° of the polarization plane relative to the birefringent axis of the fiber. The polarization preserving fiber 218 functions as a birefringent medium to divide the input optical signal into two polarization components and to output them after separating them in the time base by the amount (12.5 ps) of the polarization mode dispersion of the polarization preserving fiber 218. A WDM optical coupler 220 combines the output from the polarization preservation fiber 218 with the control light 216 from the control light input port 214. The timing between the optical signal 212 and the control light 216 is adjusted so that at the output stage of the WDM optical coupler 220, a control light pulse 226 is located between a preceding optical signal pulse 222 and a following optical signal pulse 224 output from the polarization preserving fiber 218. The preceding optical signal pulse 222, the control light pulse 226, and the following optical signal pulse 224 enter a semiconductor optical amplifier (SOA) 228 in this order.

The SOA 228 is forward biased by a direct power source 230. For example, the SOA 228 consists of a buried waveguide using the InGaAsP/InP system as an active layer material, and both ends are applied with antireflection coating. When the control light pulse 226 enters, the gain in the SOA 228 instantly decreases due to the stimulated emission, gain saturation occurs, and the carrier density in the SOA 228 decreases. Since the refractive index of the semiconductor depends on the carrier density of the inside (band filing effect), the refractive index variation (which results in XPM) occurs at this point. That is, the refractive index of the SOA 228 varies before and after the entry of the control light pulse 226. Therefore, the following optical signal pulse 224 receives a phase shift different from that of the preceding optical signal pulse 222 while transmitting in the SOA 228. Since the amount of the phase shift varies according to the optical intensity and wavelength of the control light pulse 226 and injected electric current of the SOA 228, the optical intensity and wavelength of the control light pulse 226 and the injected current of the SOA 228 are set so that the amount of the phase variation of the following optical signal pulse 224 caused by the existence and the nonexistence of the control light pulse 226 becomes π. With this configuration, the phase of the following optical signal pulse 224 output from the SOA 228 differs by π according to whether or not the control light pulse 226 exists.

The optical signal pulses 222 and 224 passed through the SOA 228 enter a 7.5 m long polarization preserving fiber 232 in the direction that the polarization plane of the preceding pulse 222 coincides with the slow axis of the polarization preserving fiber 232 and the polarization plane of the following pulse 224 coincides with the fast axis of the fiber 232. With this configuration, the time difference between the optical signal pulses 222 and 224 is almost disappeared after they passed through the polarization preserving fiber 232. To cancel the individual difference of the polarization mode dispersion amount between the polarization preserving fibers 218 and 232, a polarization phase adjuster 234 is disposed at the output of the polarization preserving fiber 232. Reference numerals 224a and 226a denote the preceding optical signal pulse and the following optical signal pulse output from the polarization phase adjuster 234 respectively.

A polarizer 236 is disposed on the output side of the polarization phase adjuster 234 so that the polarizer 236 passes the light having the same polarization direction with that of the composite polarization of the preceding optical signal pulse 222a and the following optical signal pulse 224a when the optical signal pulse 226 exists. When the optical signal pulse 226 does not exist, the composite polarization direction of the preceding optical signal pulse 222a and the following optical signal pulse 224a becomes orthogonal to that of the polarizer 236. Accordingly, the polarizer 236 passes only the optical signal in the condition that the control light pulse 226 exists out of the optical output from the polarization phase adjuster 234. An optical bandpass filter 238 exclusively extracts the component having the wavelength equal to that of the optical input signal 212 from the output of the polarizer 236. With this operation, the remaining components of the control light 216 are removed.

In the conventional example shown in FIG. 7, the operation of the optical switch is realized using the XPM of the SOA 228. Since the signals passed through the sole SOA 228 are interfered each other, it is unnecessary to completely balance the operating conditions of two SOAs unlike an interferometer having two optical paths, and accordingly the operation becomes stable. Moreover, its speed is so high that an optical switch as fast as 100 Gbit/s or more has been reported (see K. L. Hall et al., Optics Letters, vol. 23, pp. 1271–1273, 1998).

However, the recovery time of the XPM in the SOA 228 is as long as approximately 100 ps. Accordingly, although the optical switching speed itself is very high, the pattern effect becomes evident. For example, the characteristics to switch the optical signal 212 vary per pulse when applied to the control light 216 of the random pulse train.

FIGS. 8(a)–(d) show waveform examples showing the pattern effect, and the time variation of the carrier density in the SOA 228. FIG. 8(a) shows the waveform of the input optical signal 212, FIG. 8(b) shows the waveform of the control light 216, FIG. 8(c) shows the waveform of the optical signal output from the optical bandpass filter 238, and FIG. 8(d) shows the time variation of the carrier density. As shown in FIGS. 8(a), (b), each pulse of the input optical signal 212 has a uniform pulse height, and each pulse of the control light 216 also has a uniform pulse height. When the control light pulses continue, the phase shift amount of the SOA 228 reduces because the XPM is repeated without achieving the complete recovery. Accordingly, when the control light pulses continue, the peak value of the optical output signal from the optical bandpass filter 238 reduces as shown in FIG. 8(c). This phenomenon is called the pattern effect. As shown in FIG. 8(d), the amount of the carrier variation caused by the input of the control light pulse, namely the amount of the refractive index variation, differs per control light pulse. This causes the pattern effect.

Also, in the conventional example, since the interferometer is composed of polarization dividing/combining using the birefringent of the two several meter long polarization preserving fibers 218 and 232, there is a problem in which the operation tends to be unstable because it is easily affected by the ambient conditions, such as temperature and vibration. In addition, it is not suitable for the mass production due to the structure.

Furthermore, in the high speed optical transmission systems, it has been expected to realize an optical TDM demultiplexer which not only extract a pulse component of specific time slot from an optical pulse train but also output the remaining time slot pulse component.

SUMMARY OF THE INVENTION

It is therefore an object of the present invention to provide an optical gate to shorten the recovery time of XPM in a SOA and to operate with stability and less pattern effect.

Another object of the present invention is to provide an optical gate which is compact, outstanding at the stability against long term environmental variation, and suitable for the mass production.

A further object of the present invention is to provide an optical gate capable of demultiplexing an optical input pulse train into two portions using optical control in the time domain.

Still a further object of the present invention is to provide an optical phase modulator of high-speed operation to modulate a phase of an optical signal using another light.

An even further object of the present is to provide an optical phase modulator to stably operate at high speed.

An optical gate according to the invention consists of a polarization divider to divide an optical signal into two orthogonal polarization components and to output them as a first polarization component which precedes in the time base and a second polarization component which follows the first one in the time base, a semiconductor optical amplifier to modulate a phase of the second polarization component output from the polarization divider according to a control light, an assist light supplier to supply to the semiconductor optical amplifier an assist light to help the recovery of the refractive index variation of the semiconductor optical amplifier caused by the control light, a polarization combiner to combine the first and second polarization components of the optical signal transmitting the semiconductor optical amplifier so as to adjust them in the same time location, and a polarization extractor to extract a predetermined polarization direction component from the output from the polarization divider.

An optical phase modulator according to the invention consists of a semiconductor optical amplifier to which a control light and optical signal input and which is forward biased and varies its refractive index relative to the optical signal according to the intensity variation of the control light, and an assist light supplier to supply to the semiconductor optical amplifier an assist light to help the recovery of the refractive index variation of the semiconductor optical amplifier caused by the control light.

BRIEF DESCRIPTION OF THE DRAWING

The above and other objects, features and advantages of the present invention will be apparent from the following detailed description of the preferred embodiments of the invention in conjunction with the accompanying drawings, in which:

FIG. 9 shows a schematic block diagram of a fourth embodiment according to the invention.

DESCRIPTION OF THE PREFERRED EMBODIMENT

Embodiments of the invention are explained below in detail with reference to the drawings.

Figure 1:
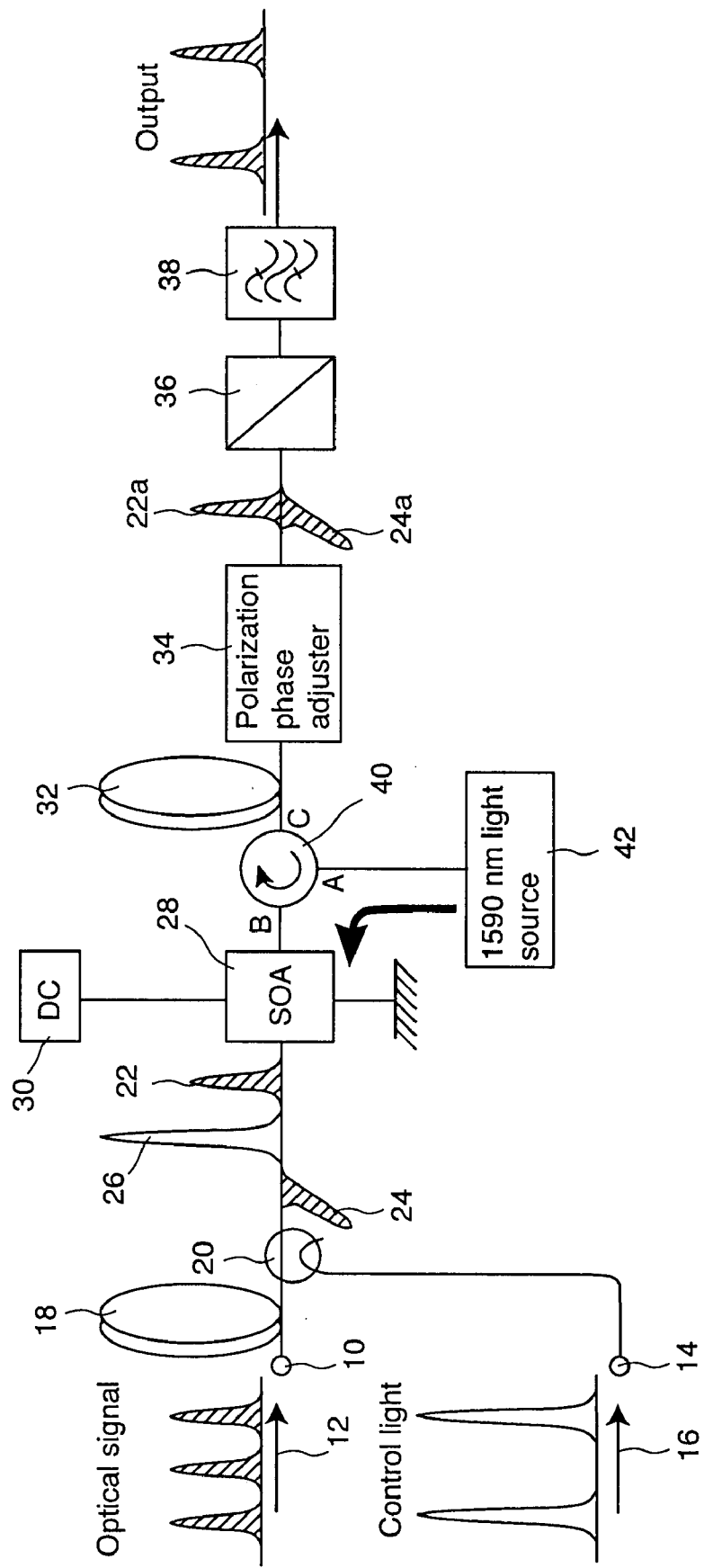
FIG. 1 shows a schematic diagram of a first embodiment according to the invention.

FIG. 1 shows a schematic diagram of a first embodiment according to the invention. An optical signal 12 of wavelength 1550 nm enters an optical signal input port 10, and a control light 16 of wavelength 1540 nm enters a control light input port 14. For example, the optical signal 12 consists of a 40 Gbit/s optical clock signal of linear polarization, and the control light 16 consists of a 40 Gbit/s RZ optical pulse train synchronized with the optical signal 12.

The optical signal 12 from the optical signal input port 10 enters a 7.5 m long polarization preserving fiber 18 at an angle of 45° of the polarization plane relative to the birefringent axis of the fiber. The polarization preserving fiber 18 functions as a birefringent medium to divide the input optical signal into two polarization components and to output them after separating them in the time base by 12.5 ps, which is the amount of the polarization mode dispersion of the polarization preserving fiber 18. A WDM optical coupler 20 combines the optical output from the polarization preserving fiber 18 with the control light 16 from the control light input port 14. The timing between the optical signal 12 and the control light 16 is adjusted so that at the output stage of the WDM optical coupler 20, a control light pulse 26 is located between a preceding optical signal pulse 22 and a following optical signal pulse 24 output from the polarization preserving fiber 18. The preceding optical signal pulse 22, control light pulse 26, and following optical signal pulse 24 continuously enter a semiconductor optical amplifier (SOA) 28 in this order.

The SOA 28 is forward biased by a direct power source 30. Similarly to the SOA 228, the SOA 28 consists of a buried waveguide using the InGaAsP/InP system as an active layer material, for example, and its both ends are applied with antireflection coating. The optical intensity and wavelength of the control light pulse 26 are set so that the amount of the phase variation of the following optical signal pulse 24 caused by the existence and the nonexistence of the control light pulse 26 becomes π. With this configuration, the phase of the following optical signal pulse 24 output from the SOA 28 differs by π according to whether or not the control light pulse 26 exists.

The optical signal pulses 22 and 24 passed through the SOA 28 enter a 7.5 m long polarization preserving fiber 32 through ports B and C of an optical circulator 40. The polarization preserving fiber 32 is disposed so that the polarization plane of the preceding pulse 22 coincides with the slow axis of the polarization preserving fiber 32 and the polarization plane of the following pulse 24 coincides with the fast axis of the fiber 32. With this configuration, the time difference between the optical signal pulses 22 and 24 is almost disappeared after they passed through the polarization preserving fiber 32. To cancel the individual difference of the polarization mode dispersion amount between the polarization preserving fibers 18 and 32, a polarization phase adjuster 34 is disposed at the output of the polarization preserving fiber 32. Reference numerals 24a and 26a denote the preceding optical signal pulse and the following optical signal pulse output from the polarization phase adjuster 34 respectively.

A polarizer 36 is disposed on the output side of the polarization phase adjuster 34 so that the polarizer 36 passes the light having the same polarization direction with that of the composite polarization of the preceding optical signal pulse 22a and the following optical signal pulse 24a when the optical signal pulse 26 exists. When the optical signal pulse 26 does not exist, the composite polarization direction of the preceding optical signal pulse 22a and the following optical signal pulse 24a becomes orthogonal to that of the polarizer 36. Accordingly, the polarizer 36 passes only the optical signal in the condition that the control light pulse 26 exists out of the optical outputs from the polarization phase adjuster 34. An optical bandpass filter 38 exclusively extracts the component having the wavelength equal to that of the optical input signal 12 from the output of the polarizer 36. With this operation, the remaining components of the control light 16 are removed.

In this embodiment, a CW light source 42 of wavelength 1590 nm is disposed to supply a CW light into a port A of an optical circulator 40. The optical circular 40 supplies the CW light from the CW light source 42 to the SOA 28 in the opposite direction with the optical signal. It is also applicable to use a 3 dB coupler instead of the optical circulator 40.

As explained referring to FIGS. 8(a)–(d), the pattern effect is a phenomenon as follows. Owing to the entry of the control light, the gain is saturated and the carrier density is reduced causing the refractive index variation. The recovery time (the time in which the carrier density returns to the normal condition) of the refractive index variation is approximately several 100 ps. Since this time is about one figure longer than the repetition time of the optical signal, the refractive index variation by the control light differs per control light pulse according to whether or not the preceding control light pulse exists. Namely, when the control light pulses continuously transmit, the carrier density in the SOA is gradually lowered and the variation amount is also reduced. Conversely, when the control light pulse transmits immediately after the condition in which the control light did not exist for a while, the variation amount returns to the beginning state.

In this embodiment, by introducing the CW light (assist light) of wavelength 1590 nm into the SOA 28, the recovery time of the carrier density and refractive index can be shortened to the extent approximately equal to the repetition time of the optical signal. The reason for the shortening is explained below.

Figure 2:
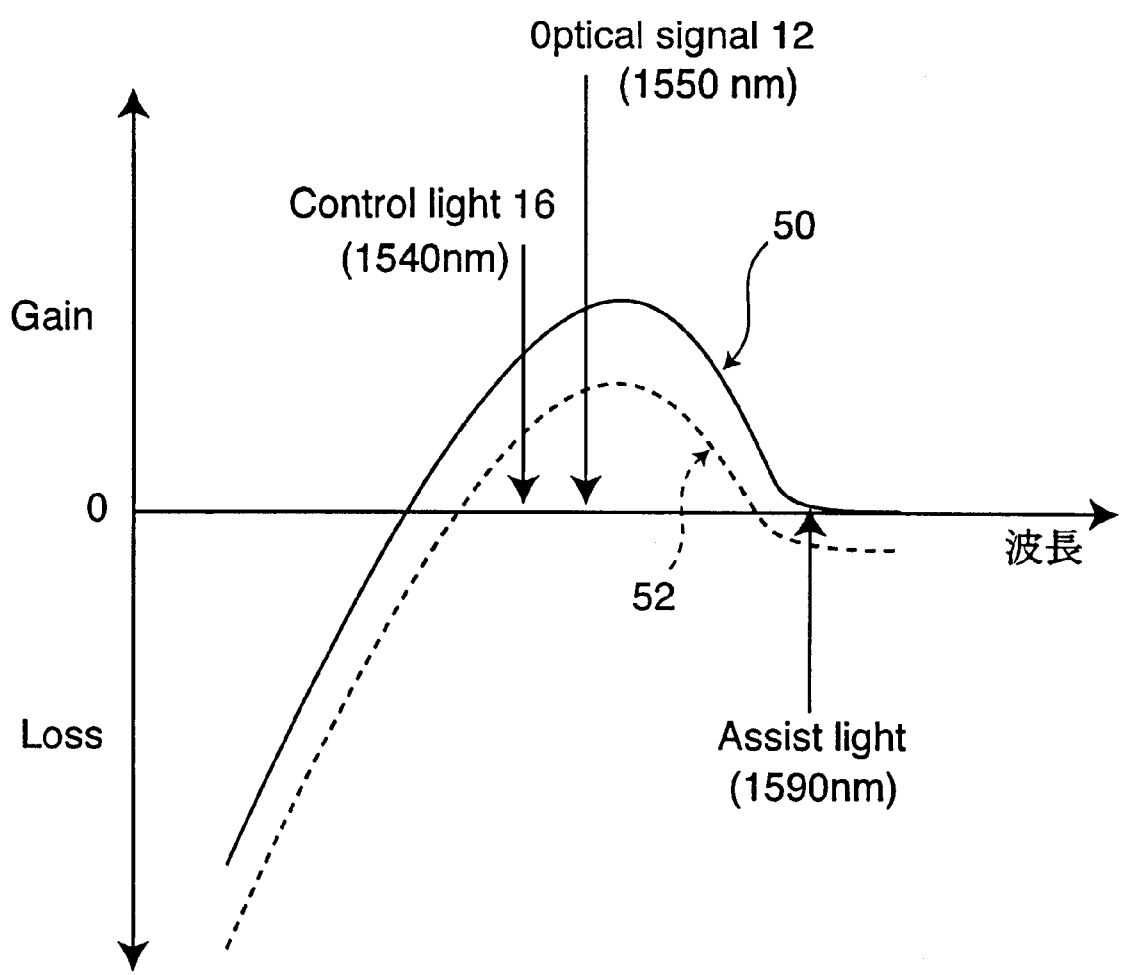
FIG. 2 shows the relation of the gain spectrum of a semiconductor optical amplifier 28 with an optical signal wavelength, control light wavelength, an assist light wavelength.

FIG. 2 shows the relation of the gain spectrum in the SOA 28 to the wavelengths of the optical signal 12, control light 16, and assist light. Reference numeral 50 denotes the gain spectrum before the entry of the control light 16. At this stage, the gain spectrum shows gain for the optical signal 16 of wavelength 1550 nm and is almost transparent for the assist light of wavelength 1590 nm. Accordingly, the assist light does not affect the gain spectrum of the SOA 28 in the condition that the control light 16 does not exist. Reference numeral 52 shows the gain spectrum immediately after the control light 16 enters the SOA 28. At this stage, the gain is reduced due to the gain saturation caused by the entry of the control light 16 of wavelength 1540 nm, and the assist light of wavelength 1590 nm is absorbed by the SOA 28. This absorbed carrier helps the gain spectrum to recover rapidly and to return to the beginning characteristic 50. The recovery time shortens as the intensity of the assist light increases. For instance, the recovery time is shortened approximately 30 ps when the assist light is 50 mW.

Figure 3A:
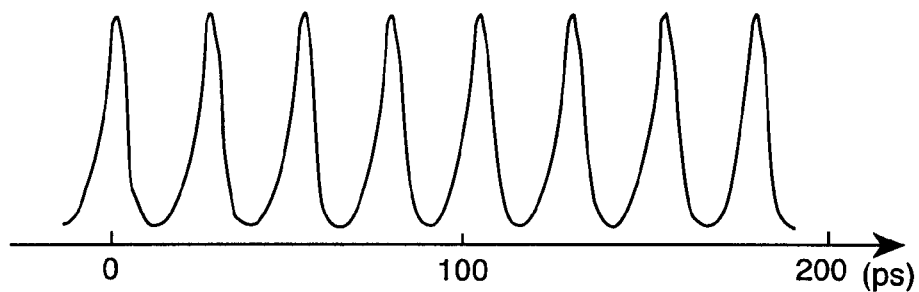
FIGS. 3(a)–(d) show waveform examples of the embodiment and the time variation of the carrier density in the semiconductor optical amplifier 28.
Figure 3B:
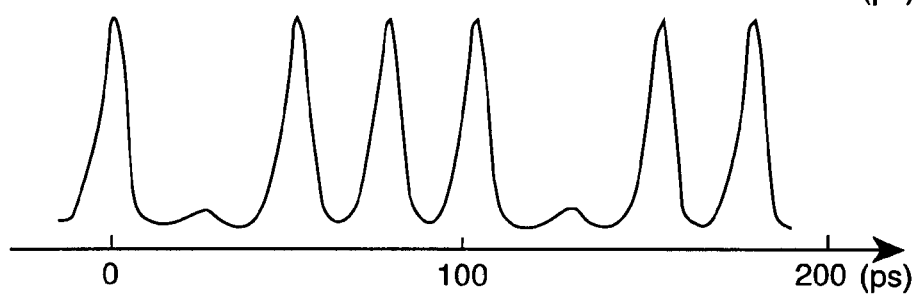
Figure 3C:
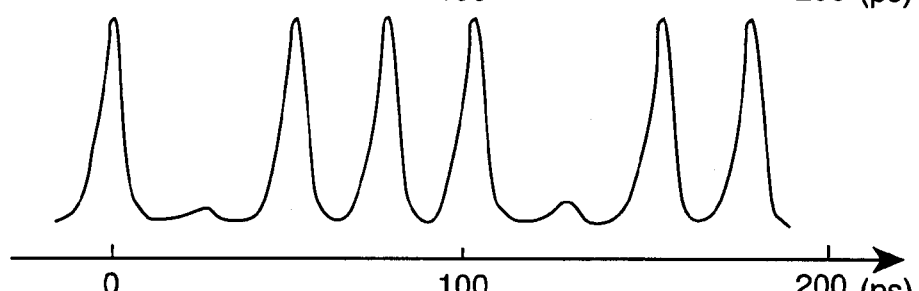
Figure 3D:
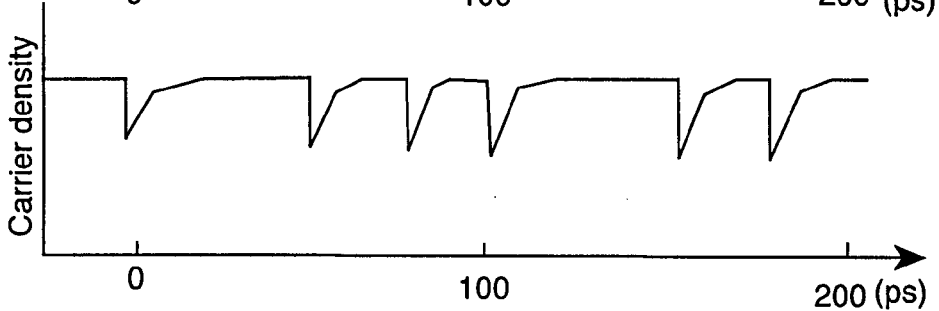

FIGS. 3(a)–(d) show waveform examples of the optical signal 12, control light 16, and optical output from the optical bandpass filter 38, and the time variation of the carrier density in the SOA 28. FIGS. 3(a)–(c) show the waveform of the optical signal 12, the waveform of the control light 16, and the waveform of the optical signal output from the optical bandpass filter 38 respectively, and 3(d) shows the time variation of the carrier density. As easily understandable by comparing to FIGS. 8(a)–(d), in this embodiment, the optical signal output from the optical bandpass filter 38 synchronizes with the control light 16 and has the uniformed peak value. As shown in FIG. 3(d), since the recovery time of the carrier density in the SOA 28 is sufficiently short, a constant variation of the carrier density relative to the control light pulse occurs without depending on the pattern.

The operation of the SOA 28 when the control light pulse enters is identical to that of the prior art. Accordingly, it is possible to realize the switching rate approximately equal to that of the prior art.

In this embodiment, by supplying the CW assist light, to which the SOA 28 is practically transparent in the condition that the control light pulse does not exist and which is absorbed by the SOA 28 after the gain spectrum variation caused by the control light pulse, to the SOA 28, the recovery time of the carrier density is shortened and consequently the pattern effect can be removed or greatly reduced. Theoretically, although the assist light should be introduced to the SOA 28 immediately after the carrier variation caused by the control light pulse 26 has changed the phase of the following optical signal 24, to achieve such timing is very troublesome, and thus to use the CW assist light is sufficient in practice.

In this embodiment, although the wavelength of the assist light is set to the 1590 nm in which the gain of the SOA 28 becomes practically zero, the same operation effect can be obtained using any wavelength for the assist light as long as it is longer than those of the optical signal 12 and control light 16 and shorter than the band edge wavelength of the SOA 23, namely the wavelength in which the gain in the longer wavelength side becomes zero.

The embodiment shown in FIG. 1 has the function to switch a 40 Gbit/s optical clock signal with a control light pulse. This function is considered the wavelength conversion from the control light wavelength of 1540 nm to the optical signal wavelength of 1550 nm. Also, when the optical signal consists of a 40 Gbit/s RZ light and the control light consists of a 10 Gbit/s light, the embodiment shown in FIG. 1 functions as a demultiplexer to demultiplex an optical pulse in a desired time slot or an optical gate to extract an optical pulse in a desired time slot. The embodiment shown in FIG. 1 also functions as an optical pulse generator to cut out an optical pulse from a CW light by a control light pulse. As explained above, the embodiment shown in FIG. 1 can perform the several functions according to the conditions of the optical signal and control light and has little pattern effect in all functions.

It is obviously possible to utilize rutile crystal ($TiO_2$) instead of the polarization preserving fibers 18 and 32. For instance, the length of the rutile crystal to give 12.5 ps of the PMD amount is approximately 15 mm. Because the rutile crystal is greatly compact and mechanically stable compared to the polarization preserving fiber, the optical switching characteristics are not affected by the external circumstances such as the ambient temperature and vibration etc., and lead to the stable operation.

Figure 4:
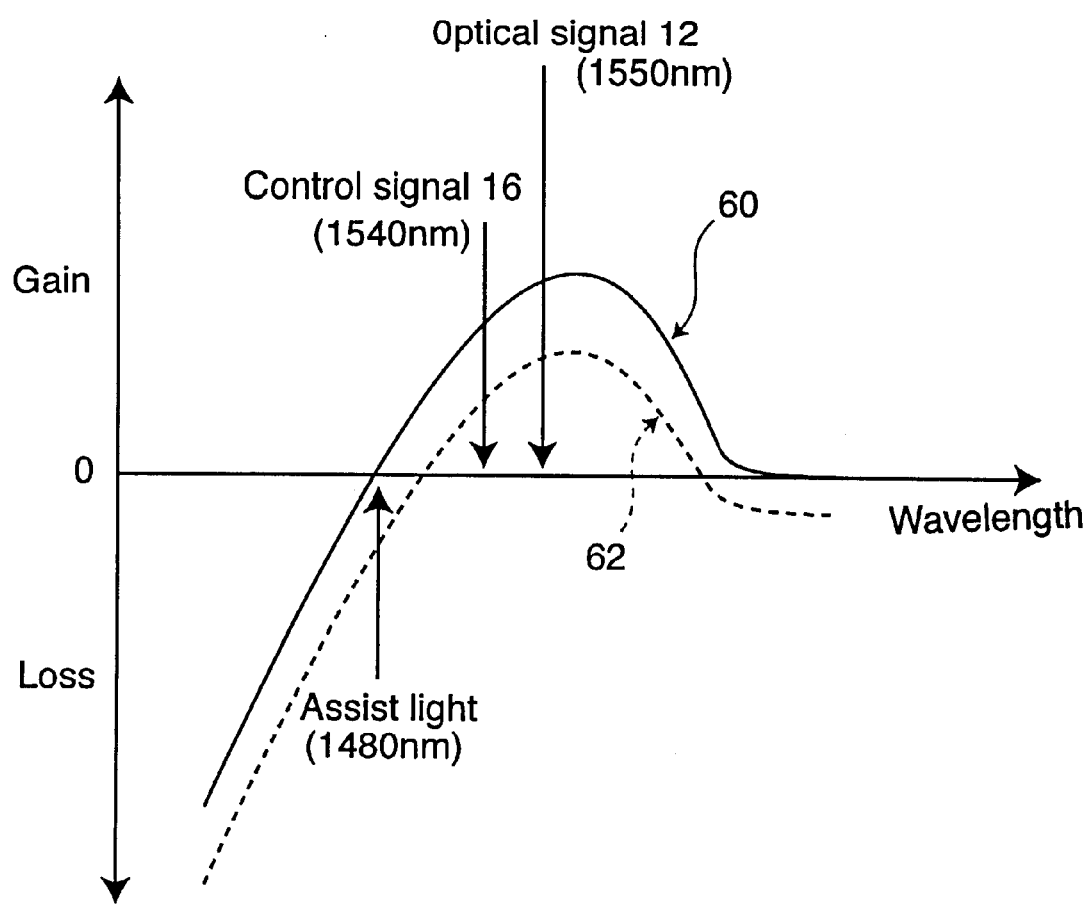
FIG. 4 shows the relation of the gain spectrum of the semiconductor optical amplifier 28 with the optical signal wavelength, control light wavelength, and assist light wavelength when a 1480 nm assist light is used.

Also, the wavelength of the assist light can be set to 1480 nm. FIG. 4 shows the gain spectrum of the SOA 28 in this condition. Reference numeral 60 denotes the gain spectrum before the control light 16 enters. This is identical to the characteristic curve 50 in FIG. 2. Reference numeral 62 denotes the gain spectrum when the control light 16 of wavelength 1540 nm enters. Although the 1480 nm wavelength is transparent when the control light 16 does not exist, it is absorbed when the control light 16 enters. Accordingly, even the assist light having the wavelength 1480 nm is used, the SOA 28 operates in the same way when the assist light of wavelength 1590 nm is used.

Generally, the wavelength of the assist light is selectable within a range of +/−50 nm to the wavelength 1480 nm in which the gain in the shorter wavelength side becomes zero.

Figure 5:
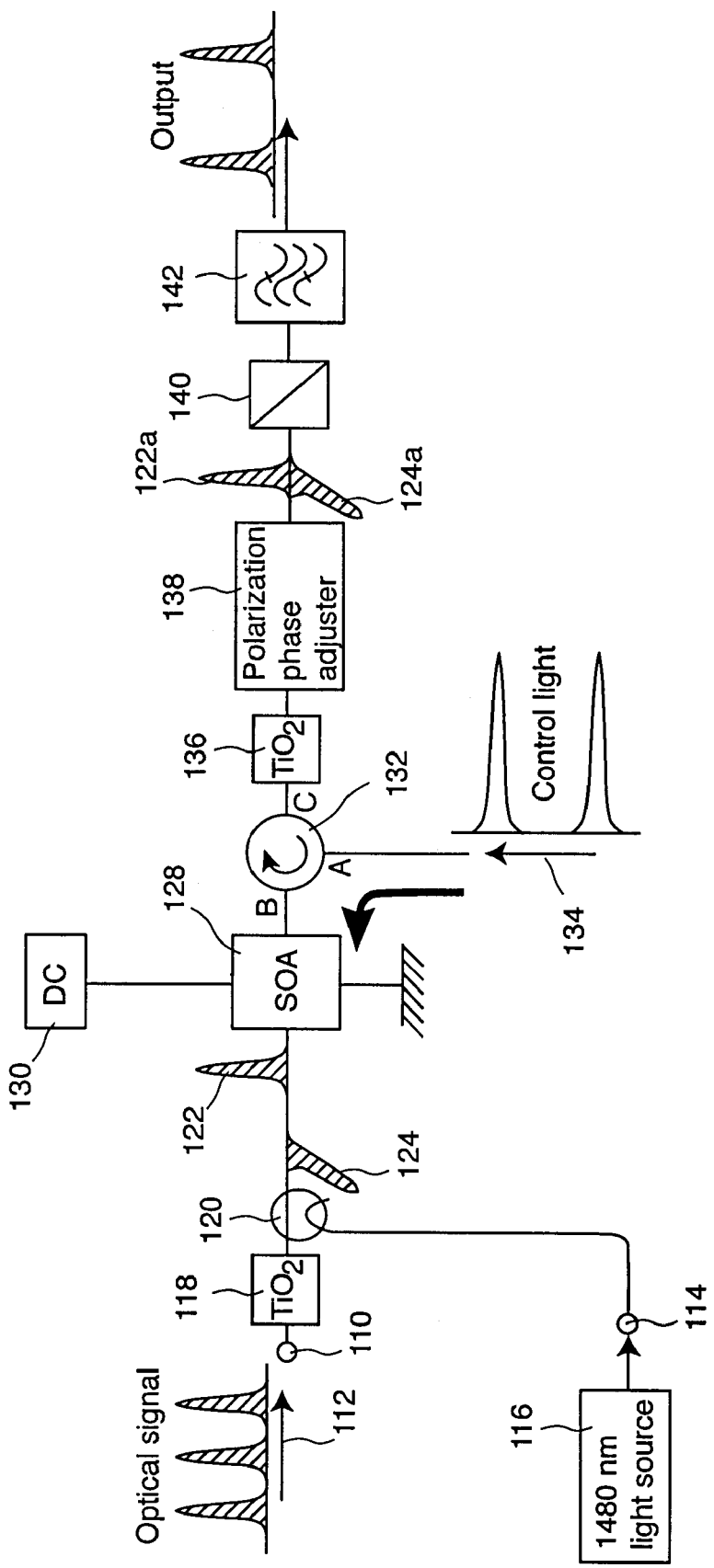
FIG. 5 shows a schematic diagram of a second embodiment according to the invention.

It is possible to transmit the optical signal and the control light in the opposite directions in the SOA. FIG. 5 shows a schematic block diagram of such modified embodiment.

An optical signal 112 of wavelength 1550 nm enters an optical signal input port 110, and a CW assist light of wavelength 1480 nm from an assist light source 116 enters assist light input port 114. For example, the optical signal 112 consists of a 40 Gbit/s optical clock signal of linear polarization.

The optical signal 112 from the optical signal input port 110 enters a rutile crystal 118 at an angle of 45° of the polarization plane relative to the birefringent axis of the rutile crystal. The rutile crystal 118 divides the input optical signal into two polarization components and output them after separating them in the time base by 12.5 ps. A WDM optical coupler 120 combines the output light from the rutile crystal 118 with the assist light from the assist light input port 114. A pulse 122 illustrated at the output stage of the WDM optical coupler 120 is an optical signal pulse preceded by the birefringent medium 118 in the time base, and a pulse 124 is a following signal pulse which is delayed in the time base. The preceding optical signal pulse 122, following optical signal pulse 124 and assist light enter a semiconductor optical amplifier (SOA) 128.

The SOA 128 is forward biased by a direct power source 130. For example, similarly to the SOAs 28 and 228, the SOA 128 consists of a buried waveguide using the InGaAsP/InP system as an active layer material, and both ends are applied with antireflection coating.

The optical signal output side of the SOA 128 connects to a port B of the optical circulator 132, and a control light 134 enters a port A of the optical circulator 132. The wavelength of the control light 134 can be any wavelength as far as the SOA 128 has gain, and can be equal to that of the optical signal 112. The optical circulator 132 transmits the control light 134 entered the port A to the port B, and accordingly the control light 134 enters the SOA 128 to propagate in the opposite direction with the optical signal. Similarly to the control light 16, the control light 134 consists of, for example, a 40 Gbit/s RZ optical pulse train. The timing of the control light 134 relative to the optical signal 112 is adjusted in advance so that the each pulse of the control light 134 enters the SOA 128 after the preceding optical signal pulse 122 is output from the SOA 128 and before the following optical signal pulse 124 enters the SOA 128. Also, the optical intensity and wavelength of the control light pulse 134 are set so that the amount of the phase variation of the following optical signal pulse 124 caused by the existence and the nonexistence of the control light pulse 134 becomes π. With this configuration, the phase of the following optical signal pulse 124 output from the SOA 128 differs by π according to whether or not the control light pulse 134 exists.

Since the assist light of wavelength 1480 nm enters the SOA 128 through an optical coupler 120, the variation of the carrier density caused by the control light 134 recovers rapidly due to the absorption of the assist light of wavelength 1480 nm. This function is similar to that of the embodiment shown in FIG. 1.

The optical signal pulses 122 and 124 passed through the SOA 128 enter the rutile crystal 136 through the ports B and C of the optical circulator 132. The rutile crystal 136 is disposed so that the polarization plane of the preceding pulse 122 coincides with the slow axis of the rutile crystal 136 and the polarization plane of the following pulse 124 coincides with the fast axis of the rutile crystal 136. With this configuration, the time difference between the optical signal pulses 122 and 124 is almost disappeared after they passed through the rutile crystal 136. To cancel the individual difference of the polarization mode dispersion amount between the rutile crystals 120 and 136, a polarization phase adjuster 138 is disposed at the output of the rutile crystal 136. Reference numerals 122a and 124a denote the preceding optical signal pulse and the following optical signal pulse output from the polarization phase adjuster 138 respectively.

A polarizer 140 is disposed on the output side of the polarization phase adjuster 138 so that the polarizer 140 passes the light having the same polarization direction with that of the composite polarization of the preceding optical signal 122a and the following optical signal pulse 124a when the control light pulse 134 exists. When the control light pulse 134 does not exist, the composite polarization direction of the preceding optical signal 122a and the following optical signal pulse 124a becomes orthogonal to that of the polarizer 140. Accordingly, the polarizer 140 passes only the optical signal in the condition that the control light pulse 134 exists out of the optical outputs from the polarization phase adjuster 138. An optical bandpass filter 142 exclusively extracts the components having the wavelength equal to the optical input signal 112 from the output of the polarizer 140. With this operation, the remaining components of the assist light are removed.

In the embodiment shown in FIG. 5, since the optical signal and the control light propagate in the opposite directions in the SOA 128, the wavelength of the optical signal and that of the control light can be identical. This configuration is effective when the wavelength conversion function is unnecessary. The effect for suppressing the pattern effect is identical to that of the first embodiment.

Figure 6:
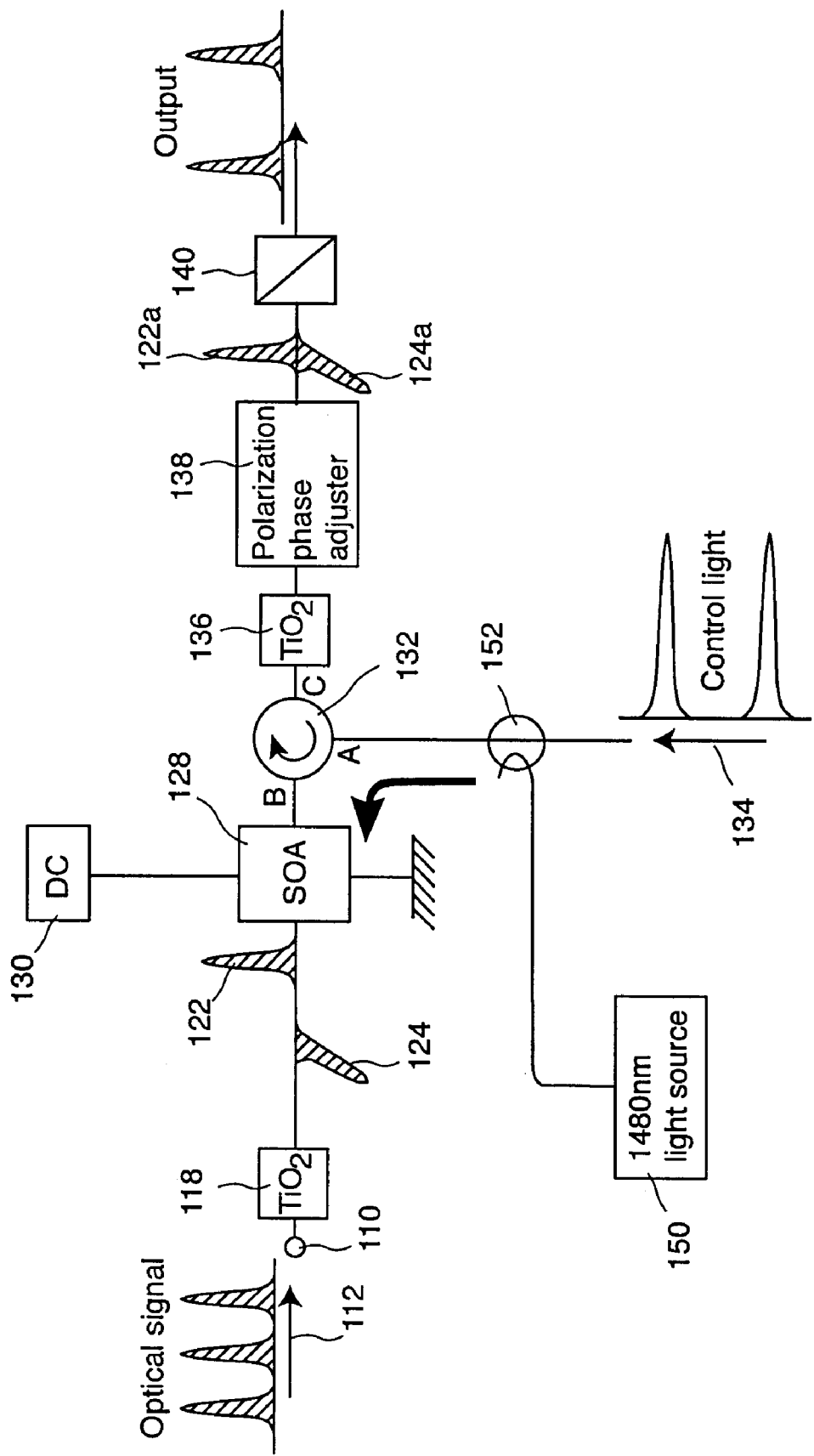
FIG. 6 shows a schematic diagram of a third embodiment according to the invention.
Figure 7:
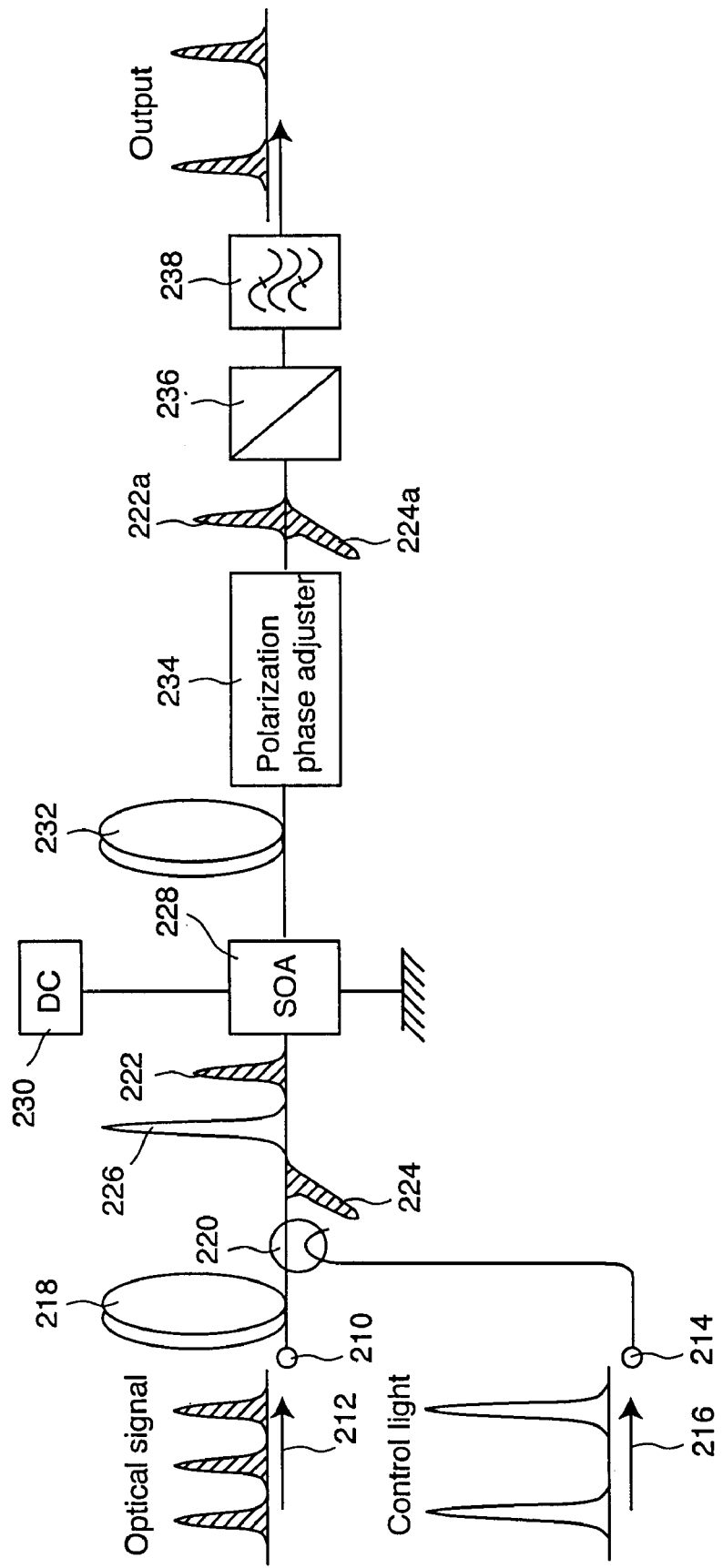
FIG. 7 shows a schematic diagram of prior art.
Figures 8A, 8B, 8C, 8D:
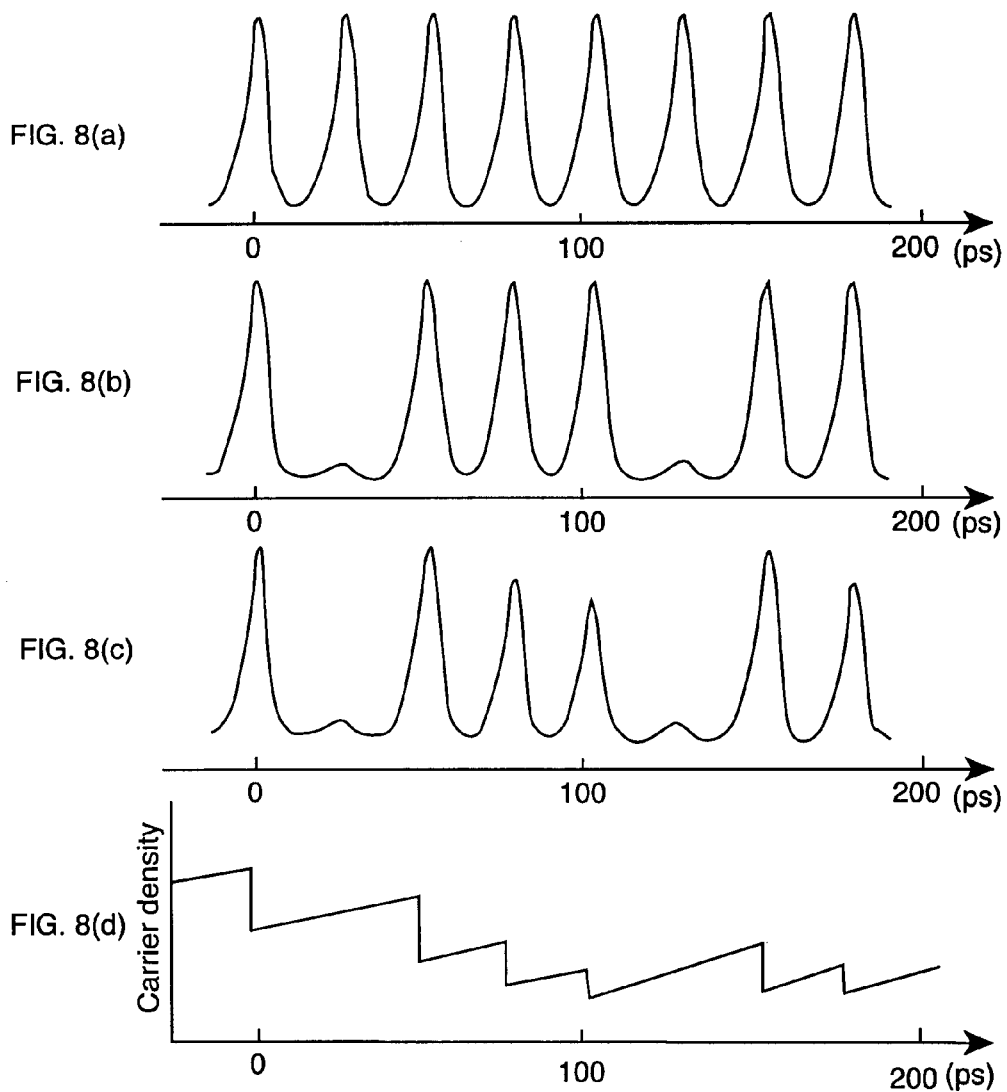
FIGS. 8(a)–(d) show waveform examples of the prior art and the time variation of the carrier density of the semiconductor optical amplifier 228.

FIG. 6 shows a schematic diagram of a third embodiment according to the invention. In the embodiment shown in FIG. 6, the control light combined with an assist light of wavelength 1480 nm enters a SOA from the back. The identical elements with those in FIG. 5 are labeled with the common reference numeral. A light source 150 outputs the assist light of wavelength 1480 nm. An optical coupler 152 combines the assist light from the light source 150 with the control light 134 and supplies the combined light to a port A of the optical circulator 132. With this operation, both assist light and control light enter the SOA 128 together from the back. That is, the optical coupler 153 is disposed instead of the optical coupler 120.

In the embodiment shown in FIG. 6, since the optical output from the polarizer 140 does not contain the assist light and control light, the optical bandpass filter 142 can be omitted.

In the embodiments shown in FIGS. 1, 5 and 6, although only the specific polarization components are extracted by the polarizers 36 and 140, such a configuration is also possible that the orthogonal two polarization components are split and output by a polarizing beam splitter. With this configuration, a light-controlled optical TDM demultiplexer is obtained to demultiplex an optical pulse train into two portions in the time domain. FIG. 9 shows a configuration example in which the embodiment shown in FIG. 1 is modified as described above. The identical elements with those in FIG. 1 are labeled with the common reference numeral.

An optical output from the polarization phase adjuster 34 enters a polarizing beam splitter 44. The polarizing beam splitter 44 is disposed in the same polarization direction with that of the polarizer 36 relative to the optical output from the polarization phase adjuster 34. The polarization of the signal pulse component on the time slot according to the timing in which the control light 26 does not exist are orthogonal to the polarization of the signal pulse component on the time slot according to the timing in which the control light 26 exists. Therefore, the polarizing beam splitter 44 splits the pulse component on the time slot according to the timing of the existence of the control light 26 and the other pulse components from the signal light 12, and output the former pulse component to the optical bandpass filter 38 and the latter to the optical bandpass filter 46. The optical bandpass filter 46 consists of the same filter characteristics with those of the optical bandpass filter 38.

As described above, the embodiment shown in FIG. 9 functions as an optical TDM demultiplexer to demultiplex the optical signal 12 into two portions in the time domain under the control of the control light 26. In this embodiment, it is selectable which time slot is output to which filter by the control light 26.

Also, in this embodiment, the polarizing beam splitter is used to divide the optical signal into two portions at the final stage, the optical signal is divided into two portions efficiently, that is, with a little loss.

In the above embodiments, although the optical signal wavelength is set to 1550 nm and the wavelength of the control light is set to 1540 nm, they are only examples. The optical signal can have any wavelength as far as it is longer than the wavelength in which a SOA has gain, and the control light can have any wavelength as far as it is the wavelength to have gain of the SOA. Accordingly it does not matter which wavelength of the optical signal or control signal is longer. Also, the assist light should not necessarily be a single wavelength laser light; a multi mode laser light is also applicable.

Although the embodiment of the 1.5 μm wavelength band is explained as the amplification band of the SOA, any amplification band between 0.4 to 2.0 μm which can be realized by the appropriate semiconductor is applicable. Although the InGaAsP/InP system is explained as the active layer material, the other materials such as GaAs/AlGaAs, InAlGaAs/InP, and InGaAlP/GaAs systems, as well as other material such as III–V semiconductor and II–IV semiconductor are applicable.

As readily understandable from the aforementioned explanation, according to the invention, it is possible to realize a polarization separation interferometer optical gate to shorten the recovery time of the XPM caused by the control light in the semiconductor optical amplifier and to operate stably having smaller pattern effect. This optical gate is compact, outstandingly stable against a long term ambient variation, and suitable for mass production.

Also, it is possible to realize an optical TDM demultiplexer to be controllable by a control light and to demultiplex an optical signal into two portions in the time domain in the combination of any time slots.

Furthermore, it is possible to realize a phase modulator to modulate a phase of a light with another light and to operate at high speed with no or little pattern effect.

While the invention has been described with reference to the specific embodiment, it will be apparent to those skilled in the art that various changes and modifications can be made to the specific embodiment without departing from the spirit and scope of the invention as defined in the claims.

What is claimed is:

1. An optical gate comprising:
    a polarization divider to divide an optical signal into two orthogonal polarization components and to output them as a first polarization component which precedes in the time base and a second polarization component which follows the first polarization component in the time base;
    a semiconductor optical amplifier having a band edge wavelength to modulate the phase of the second polarization component output from the polarization divider according to a control light;
    an assist light supplier to supply to the semiconductor optical amplifier an assist light to help recovering refractive index variation of the semiconductor optical amplifier caused by the control light;
    a polarization combiner to combine the first and second polarization components of the optical signal output from the semiconductor optical amplifier so as to adjust the outputted first and second polarization components in a same time location; and
    a polarization extractor to extract a predetermined polarization direction component from the adjusted polarization components output from the polarization combiner.

2. The optical gate of claim 1 wherein the wavelength of the assist light is shorter than the band edge wavelength of the semiconductor optical amplifier and longer than the wavelength of the control light.

3. The optical gate of claim 1 wherein the wavelength of the assist light is shorter than a wavelength in which the gain of the semiconductor optical amplifier becomes positive and included within a range of −50 nm to +50 nm of the wavelength in which the gain of the semiconductor optical amplifier becomes zero.

4. The optical gate of claim 1 further comprising an optical combiner to combine the output light from the polarization divider with the control light and to supply the combined light signal to the semiconductor optical amplifier.

5. The optical gate of claim 1 wherein the assist light supplier comprises an optical circulator which transmits the first and second polarization components of the optical signal output from the semiconductor optical amplifier to the polarization combiner and to input the assist light into the semiconductor amplifier.

6. The optical gate of claim 1 further comprising an optical combiner to transmit the first and second polarization components of the optical signal output from the semiconductor optical amplifier and to input the control light into the semiconductor optical amplifier.

7. The optical gate of claim 1 wherein the polarization divider comprises a polarization preserving optical fiber.

8. The optical gate of claim 1 wherein the polarization divider comprises a solid birefringent crystal.

9. The optical gate of claim 1 wherein the polarization extractor extracts and outputs the polarization component orthogonal to the predetermined polarization direction component from the output from the polarization combiner.

10. The optical gate of claim 1 or 9 wherein the polarization extractor comprises a polarizing beam splitter.

11. An optical phase modulator comprising:
    a semiconductor optical amplifier having a control light signal input and an optical signal input wherein the semiconductor optical amplifier is forward biased and varies its refractive index relative to the optical signal according to intensity variation of the control light; and
    an assist light supplier to supply to the semiconductor optical amplifier an assist light to help recovering the refractive index variation of the semiconductor optical amplifier caused by the control light.

12. The optical phase modulator of claim 11 wherein the wavelength of the assist light is shorter than a band edge wavelength of the semiconductor optical amplifier and longer than the wavelength of the control light.

13. The optical phase modulator of claim 11 wherein the wavelength of the assist light is shorter than the wavelength in which the gain of the semiconductor optical amplifier becomes positive and included within a range of −50 nm to +50 nm of the wavelength in which the gain of the semiconductor optical amplifier becomes zero.

14. The optical phase modulator of claim 11 further comprising an optical combiner to combine the optical signal and the control light and to supply the combined light signal to the semiconductor optical amplifier.

15. The optical phase modulator of claim 11 wherein the optical signal enters the semiconductor optical amplifier in a different direction as the directions of the control light and the assist light.

* * * * *

UNITED STATES PATENT AND TRADEMARK OFFICE
CERTIFICATE OF CORRECTION

PATENT NO. : 6,728,019 B2
DATED : April 27, 2004
INVENTOR(S) : Masashi Usami et al.

It is certified that error appears in the above-identified patent and that said Letters Patent is hereby corrected as shown below:

<u>Title page,</u>
Item [56], References Cited, U.S. PATENT DOCUMENTS, delete "2001/0022431", insert -- 2001/0024317 --

Signed and Sealed this

Fifteenth Day of February, 2005

JON W. DUDAS
*Director of the United States Patent and Trademark Office*